US008004361B2

(12) United States Patent
Lin

(10) Patent No.: US 8,004,361 B2
(45) Date of Patent: Aug. 23, 2011

(54) CONSTANT TRANSCONDUCTANCE OPERATIONAL AMPLIFIER AND METHOD FOR OPERATION

(75) Inventor: Ching-Tzung Lin, Nantou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/684,704

(22) Filed: Jan. 8, 2010

(65) Prior Publication Data

US 2011/0169567 A1 Jul. 14, 2011

(51) Int. Cl.
 *H03F 3/45* (2006.01)
(52) U.S. Cl. .......................................... 330/253; 330/51
(58) Field of Classification Search ................. 330/51, 330/253
See application file for complete search history.

(56) References Cited

U.S. PATENT DOCUMENTS

| | | | |
|---|---|---|---|
| 5,311,145 A | 5/1994 | Huijsing et al. | |
| 5,371,474 A | 12/1994 | Wassenaar et al. | |
| 5,561,396 A | 10/1996 | Hogervorst et al. | |
| 5,631,607 A | 5/1997 | Huijsing et al. | |
| 5,734,297 A | 3/1998 | Huijsing et al. | |
| 5,745,007 A | 4/1998 | Redman-White | |
| 7,042,289 B2 | 5/2006 | Hwang et al. | |
| 7,187,236 B2 | 3/2007 | Britton, Jr. et al. | |
| 7,245,181 B2 * | 7/2007 | Sanduleanu et al. | 330/253 |

OTHER PUBLICATIONS

Botma, J.H., et al., "A low-voltage CMOS Op Amp with a rail-to-rail contant-$g_m$ input stage and a class AB rail-to-rail output stage," 1993 IEEE International Symposium on Circuits and Systems, May 3-6, 1993, pp. 1314-1317.

Botma, J.H., et al., "Simple Rail-to-Rail Low-Voltage Constant-Transconductance CMOS Input Stage in Weak Inversion," Electronics Letters, Jun. 10, 1993, vol. 29, No. 12, pp. 1145-1146.

Hogervorst, R., et al., "A Compact Power-Efficient 3 V CMOS Rail-to-Rail Input/Output Operational Amplifier for VLSI Cell Libraries," IEEE Journal of Solid-State Circuits, vol. 29, No. 12, Dec. 1994, pp. 1505-1513.

(Continued)

*Primary Examiner* — Khanh V Nguyen
(74) *Attorney, Agent, or Firm* — Slater & Matsil, L.L.P.

(57) ABSTRACT

An embodiment is a circuit comprising a first transistor, a second transistor, a third transistor, a fourth transistor, a first switch, and a second switch. The first transistor, the second transistor, the third transistor, and the fourth transistor are all of a same conductivity type. Sources of the first transistor, the second transistor, the third transistor, and the fourth transistor are electrically coupled together. Drains of the first transistor and the third transistor are electrically coupled together, and drains of the second transistor and the fourth transistor are electrically coupled together. A feature of the third transistor is three times a feature of the first transistor such that $$3\left[\mu C_{ox}\left(\frac{W}{L}\right)\right]_{T1} = \left[\mu C_{ox}\left(\frac{W}{L}\right)\right]_{T3}$$

is satisfied where "T1" denotes the first transistor and "T3" denotes the third transistor, and a feature of the fourth transistor is three times a feature of the second transistor such that $$3\left[\mu C_{ox}\left(\frac{W}{L}\right)\right]_{T2} = \left[\mu C_{ox}\left(\frac{W}{L}\right)\right]_{T4}$$

is satisfied where "T2" denotes the second transistor and "T4" denotes the fourth transistor. The first switch is operable to selectively electrically couple a first input terminal to a gate of the third transistor, and the second switch is operable to selectively electrically couple a second input terminal to a gate of the fourth transistor.

21 Claims, 7 Drawing Sheets

OTHER PUBLICATIONS

Huijsing, J.H., et al., "Low-Power Low-Voltage VLSI Operational Amplifier Cells," IEEE Transactions on Circuits and Systems-I: Fundamental Theory and Applications, vol. 42, No. 11, November 1995, pp. 841-852.

Hogervorst, R., et al., "CMOS Low-Voltage Operational Amplifiers with Constant-$G_m$ Rail-to-Rail Input Stage," 1992 IEEE International Symposium on Circuits and Systems, vol. 6, May 10-13, 1992, pp. 2876-2879.

* cited by examiner

US 8,004,361 B2

CONSTANT TRANSCONDUCTANCE OPERATIONAL AMPLIFIER AND METHOD FOR OPERATION

TECHNICAL FIELD

The present invention relates generally to integrated circuits, and more particularly to an operational amplifier and method for operating the operational amplifier.

BACKGROUND

Generally, the use of operational amplifiers is common in circuit design. Traditionally, an operational amplifier (op-amp) comprised a single transistor pair with one of the differential inputs coupled to a single transistor. These single transistor pair op-amps generally could only operate with a common mode voltage $V_{CM}$ that had a magnitude such that the gate-to-source voltage $V_{GS}$ of each transistor was greater than the threshold voltage $V_t$. Any magnitude of the common mode voltage $V_{CM}$ that did not meet this condition caused the op-amp to be in an inoperable mode. Thus, these op-amps could not be operated at any common-mode voltage $V_{CM}$ between the power source rails, or in other words, could not operate rail-to-rail.

As the voltage of power sources decreased, the need to operate an op-amp rail-to-rail generally increased. In response to this need, complementary transistor pairs op-amps were introduced that comprised both a p-channel field effect transistor (PFET) pair and an n-channel field effect transistor (NFET) pair. These op-amps allowed rail-to-rail operation, but because the operation ranges of the PFET pair and the NFET pair overlapped in only a portion of the rail-to-rail common mode voltage $V_{CM}$ range, the transconductance of the op-amp $G_M$ was not generally constant. For example, when only the PFET pair was conducting, the transconductance $G_M$ was much less than the transconductance $G_M$ when both the PFET pair and NFET pair were conducting. This non-constant transconductance $G_M$ introduced problems in some circuit designs, for example, for frequency compensation for negative feedback.

Subsequent op-amps attempted to address this non-constant transconductance $G_M$ in complementary transistor pairs op-amps by steering the current through one of the transistor pairs when the other pair was not conducting to increase the transconductance $G_M$ during that operation. One way this was accomplished was by using current-mirror circuits. As a transistor pair became non-conducting, current from the pair's constant current source would be diverted into a current-mirror. The output of the current-mirror would be coupled in parallel with the other transistor pair's constant current source such that as current was diverted into the current-mirror, the current flowing through the other transistor pair would be increased. This typically would increase the transconductance $G_M$ of the op-amp while only one pair was conducting.

However, these prior art attempts to create a constant transconductance generally cause the current that flows in the op-amps to be greatly increased. This causes a much larger power consumption. Accordingly, there is a need in the art for a configuration for a complementary transistor pairs op-amp that realizes both a constant transconductance $G_M$ and lower current flows.

SUMMARY

These and other problems are generally solved or circumvented, and technical advantages are generally achieved, by embodiments.

In accordance with an embodiment, a circuit comprises a first transistor, a second transistor, a third transistor, a fourth transistor, a first switch, and a second switch. The first transistor, the second transistor, the third transistor, and the fourth transistor are all of a same conductivity type. Sources of the first transistor, the second transistor, the third transistor, and the fourth transistor are electrically coupled together. Drains of the first transistor and the third transistor are electrically coupled together, and drains of the second transistor and the fourth transistor are electrically coupled together. A feature of the third transistor is three times a feature of the first transistor such that $$3\left[\mu C_{ox}\left(\frac{W}{L}\right)\right]_{T1} = \left[\mu C_{ox}\left(\frac{W}{L}\right)\right]_{T3}$$

is satisfied where "T1" denotes the first transistor and "T3" denotes the third transistor, and a feature of the fourth transistor is three times a feature of the second transistor such that $$3\left[\mu C_{ox}\left(\frac{W}{L}\right)\right]_{T2} = \left[\mu C_{ox}\left(\frac{W}{L}\right)\right]_{T4}$$

is satisfied where "T2" denotes the second transistor and "T4" denotes the fourth transistor. The first switch is operable to selectively electrically couple a first input terminal to a gate of the third transistor, and the second switch is operable to selectively electrically couple a second input terminal to a gate of the fourth transistor.

In accordance with another embodiment, an operational amplifier comprises a first re-channel field effect transistor (NFET), a second NFET, a third NFET, a fourth NFET, a first p-channel field effect transistor (PFET), a second PFET, a third PFET, a fourth PFET, a first switch, and a second switch. Respective sources of the first NFET, the second NFET, the third NFET, and the fourth NFET are electrically coupled together, and respective sources of the first PFET, the second PFET, the third PFET, and the fourth PFET are electrically coupled together. Respective drains of the first NFET and the third NFET are electrically coupled together, and respective drains of the second NFET and the fourth NFET are electrically coupled together. Respective drains of the first PFET and the third PFET are electrically coupled together, and respective drains of the second PFET and the fourth PFET are electrically coupled together.

A feature of the third NFET is three times a feature of the first NFET such that $$3\left[\mu C_{ox}\left(\frac{W}{L}\right)\right]_{N1} = \left[\mu C_{ox}\left(\frac{W}{L}\right)\right]_{N3}$$

is satisfied where "N1" denotes the first NFET and "N3" denotes the third NFET, and a feature of the fourth NFET is three times a feature of the second NFET such that $$3\left[\mu C_{ox}\left(\frac{W}{L}\right)\right]_{N2} = \left[\mu C_{ox}\left(\frac{W}{L}\right)\right]_{N4}$$

is satisfied where "N2" denotes the second NFET and "N4" denotes the fourth NFET. A feature of the third PFET is three times a feature of the first PFET such that $$3\left[\mu C_{ox}\left(\frac{W}{L}\right)\right]_{P1} = \left[\mu C_{ox}\left(\frac{W}{L}\right)\right]_{P3}$$

is satisfied where "P1" denotes the first PFET and "P3" denotes the third PFET, and a feature of the fourth PFET is three times a feature of the second PFET such that $$3\left[\mu C_{ox}\left(\frac{W}{L}\right)\right]_{P2} = \left[\mu C_{ox}\left(\frac{W}{L}\right)\right]_{P4}$$

is satisfied where "P2" denotes the second PFET and "P4" denotes the fourth PFET. The first switch is operable to selectively electrically couple a first input terminal to a gate of the third NFET, and a gate of the first NFET is also electrically coupled to the first input terminal. The second switch is operable to selectively electrically couple the first input terminal to a gate of the third PFET, and a gate of the first PFET is also electrically coupled to the first input terminal.

In accordance with a further embodiment, a method for operating an operation amplifier comprises sensing a first transition between a conducting state and a non-conducting state of a first pair of transistors and selectively electrically coupling a gate of one of a first switched pair of transistors to a gate of one of a second pair of transistors and electrically coupling a gate of another of the first switched pair of transistors to a gate of another of the second pair of transistors in response to the sensing the first transition. The respective gates of the first switched pair of transistors are electrically decoupled from the respective gates of the second pair of transistors when the first transition is from the non-conducting state to the conducting state, and the respective gates of the first switched pair of transistors are electrically coupled to the respective gates of the second pair of transistors when the first transition is from the conducting state to the non-conducting state.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that embodiments provide many applicable inventive concepts that can be embodied in a wide variety of specific contexts. The specific embodiments discussed are merely illustrative of specific ways to make and use the invention, and do not limit the scope of the invention.

Embodiments will be described with respect to a specific context, namely a complementary transistors pairs operational amplifier (op-amp). Other embodiments may also be used, however, in any op-amp wherein a constant transconductance for complementary transistors pairs is desirable or wherein varying a transconductance of the op-amp is desirable.

Figure 1:
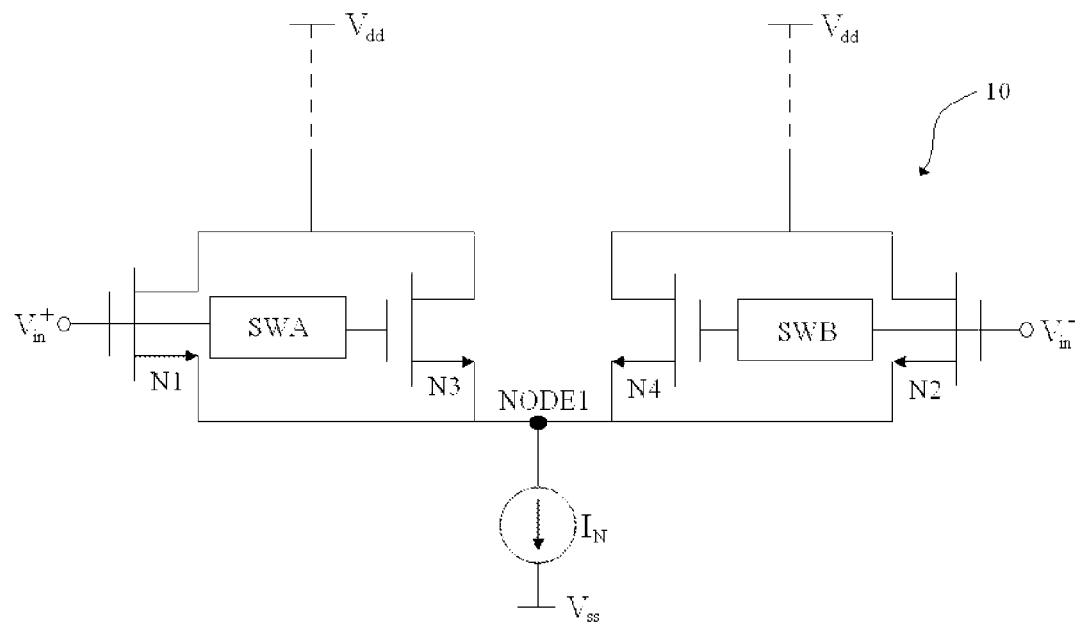
FIG. 1 is a differential operational amplifier (op-amp) with a switched pair of n-channel field effect transistors (NFETs) according to an embodiment.

FIG. 1 illustrates a differential op-amp 10 with a switched pair of NFETs according to an embodiment. The op-amp 10 comprises a first NFET N1 that has a drain coupled to a drain of a third NFET N3, which is coupled directly or indirectly to a positive power supply voltage $V_{dd}$, as indicated by the dashed line. The sources of the first NFET N1 and the third NFET N3 are couple together and to a constant tail current source $I_N$ at a first node NODE1. The constant tail current source $I_N$ is coupled to a negative power supply voltage $V_{ss}$. The op-amp 10 further comprises a second NFET N2 that has a drain coupled to a drain of a fourth NFET N4, which is coupled directly or indirectly to a positive power supply voltage $V_{dd}$, as indicated by the dashed line. The sources of the second NFET N2 and the fourth NFET N4 are couple together and to the constant tail current source $I_N$ at the first node NODE1.

The gate of the first NFET N1 is coupled to a positive input terminal $V_{in}^+$ of the differential op-amp 10. The gate of the third NFET N3 is coupled to a first switch SWA, which is also coupled to the positive input terminal $V_{in}^+$. The gate of the second NFET N2 is coupled to a negative input terminal $V_{in}^-$ of the differential op-amp 10. The gate of the fourth NFET N4 is coupled to a second switch SWB, which is also coupled to the negative input terminal $V_{in}^-$.

In this embodiment, the active area width-to-length ratio of the first NFET N1 and the second NFET N2 are equal, such that $$\left(\frac{W}{L}\right)_{N1} = \left(\frac{W}{L}\right)_{N2} = \left(\frac{W}{L}\right)_N.$$

The width-to-length ratio of the third NFET N3 and the fourth NFET N4 are equal but are three times the width-to-length ratios of the first NFET N1 and the second NFET N2, such that $$\left(\frac{W}{L}\right)_{N3} = \left(\frac{W}{L}\right)_{N4} = 3\left(\frac{W}{L}\right)_{N}.$$

The width-to-length ratios of the first NFET N1 and the second NFET N2 may be increased comparatively by increasing the width or by decreasing the length. As will become readily apparent to persons having ordinary skill in the art by the discussion below, other embodiments contemplate all of the width-to-length ratios being equal, but other features of the third NFET N3 and the fourth NFET N4 being three times the value of those features of the first NFET N1 and the second NFET N2. One example may be using a material with a relative permittivity $\in_r$ for the gate dielectric of the third NFET N3 and the fourth NFET N4 that is three times greater than that used for the first NFET N1 and the second NFET N2 such that the capacitance per unit area between the gate electrode and channel $C_{ox}$ for the third NFET N3 and the fourth NFET N4 is three times greater than such capacitance for the first NFET N1 and the second NFET N2.

Figure 2:
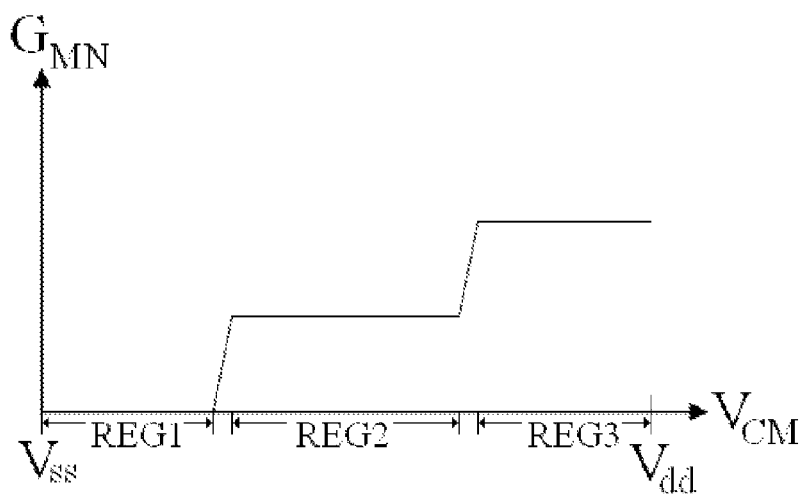
FIG. 2 is a graph illustrating the relative transconductance of the op-amp of FIG. 1 with a common-mode voltage ranging from the negative power supply voltage to the positive power supply voltage.

FIG. 2 is a graph illustrating the relative transconductance $G_{MN}$ of the op-amp 10 with a common-mode voltage $V_{CM}$ ranging from the positive power supply voltage $V_{dd}$ to the negative power supply voltage $V_{ss}$. The transconductance $G_{MN}$ may be defined as follows:

$$G_{MN} = \begin{cases} g_{mn1} & \text{for } REG1 \\ g_{mn2} & \text{for } REG2 \\ g_{mn3} & \text{for } REG3 \end{cases} \quad (1)$$

The first region REG1 is an operating mode in which all of the NFETs are in a non-conducting, or off, state. Thus, in the first region REG1, the transconductance $g_{mn1}$ is zero. The second region REG2 is an operating mode in which the first NFET N1 and the second NFET N2 are conducting in saturation, or turned on, but the first switch SWA and the second switch SWB are open such that the third NFET N3 and the fourth NFET N4 are not conducting. Thus, in the second region REG2, the transconductance $g_{mn2}$ is determined only by the first NFET N1 and the second NFET N2 such that the transconductance $g_{mn2}$ is equal to the NFET transconductance $g_{mn}$, or $g_{mn2}=g_{mn}$. The third region REG3 is an operating mode in which the first NFET N1 and the second NFET N2 are conducting in saturation, or turned on, and the first switch SWA and the second switch SWB are closed such that the third NFET N3 and the fourth NFET N4 are also conducting in saturation, or turned on. Thus, in the third region REG3, the transconductance $g_{mn3}$ is determined by the first NFET N1, the second NFET N2, the third NFET N3, and the fourth NFET N4, such that the transconductance $g_{mn3}$ is equal to the twice the NFET transconductance $g_{mn}$, or $g_{mn3}=2g_{mn}$.

When the common-mode voltage $V_{CM}$ is in the second region REG2, the transconductance $g_{mn2}$ of the op-amp 10 would be, as would be apparent to a person having ordinary skill in the art, equal to $$\sqrt{\mu_N C_{ox}\left(\frac{W}{L}\right)_N I_N},$$

or as shown in equation (2) below:

$$g_{mn2} = g_{mn} = \sqrt{\mu_N C_{ox}\left(\frac{W}{L}\right)_N I_N} \quad (2)$$

The steps and equations for reaching this result are below.

As is known in the art, general transconductance $g_m$ is defined as follows:

$$g_m = \frac{\partial i_D}{\partial v_{GS}}\bigg|_{v_{gs}=V_{GS}} \quad (3)$$

Further, analyzing the left hand side of FIG. 1 independently because of symmetry, the total drain current $i_D$ is the sum of the drain current $i_{D,N1}$ of the first NFET N1 and the drain current $i_{D,N3}$ of the third NFET N3.

$$i_D = i_{D,N1} + i_{D,N3} \quad (4)$$

Even further, the drain current $i_{D,N1}$ and $i_{D,N3}$ for each of the first NFET N1 and the third NFET N3 are defined below, as is also commonly known in the art.

$$i_{D,N1} = \frac{1}{2}\mu_N C_{ox}\left(\frac{W}{L}\right)_N (v_{GS} - V_t)^2 \quad (5)$$

$$i_{D,N3} = \frac{1}{2}\mu_N C_{ox}(3)\left(\frac{W}{L}\right)_N (v_{GS} - V_t)^2 \quad (6)$$

As stated above, when the common-mode voltage $V_{CM}$ is in the second region REG2, the first switch SWA is open which causes the third NFET N3 to not have any voltage applied to its gate resulting in the third NFET N3 not conducting any current. Accordingly, the drain current $i_{D,N3}$ for the third NFET N3 is zero, or $i_{D,N3}=0$. Therefore, equation (5) can be substituted into equation (4), which then has its derivative determined to find the transconductance $g_{mn2}$ as stated in equation (3).

$$g_{mn2} = \frac{\partial i_D}{\partial v_{GS}}\bigg|_{v_{gs}=V_{GS}} = \mu_N C_{ox}\left(\frac{W}{L}\right)_N (V_{GS} - V_t) \quad (7)$$

Further, the drain current $i_{D,N1}$ of the first NFET N1 is equal to half of the constant tail current $I_N$, or as shown in equation (8).

$$i_{D,N1} = \frac{I_N}{2} \quad (8)$$

Substituting equation (5) into equation (8) and solving for $(V_{GS}-V_t)$ results in equation (9).

$$(V_{GS} - V_t) = \sqrt{\frac{I_N}{\mu_N C_{ox}\left(\frac{W}{L}\right)_N}} \quad (9)$$

Substituting equation (9) into equation (7) results in equation (10).

$$g_{mn2} = \sqrt{\mu_N C_{ox}\left(\frac{W}{L}\right)_N I_N} \tag{10}$$

When the common-mode voltage $V_{CM}$ is in the third region REG3, the transconductance $g_{mn3}$ of the op-amp 10 would be equal to $$\sqrt[2]{\mu_N C_{ox}\left(\frac{W}{L}\right)_N I_N},$$

or as shown in equation (11) below:

$$g_{mn3} = 2g_{mn} = \sqrt[2]{\mu_N C_{ox}\left(\frac{W}{L}\right)_N I_N} \tag{11}$$

In the third region REG3, both the first NFET N1 and the third NFET N3 are conducting. Accordingly, to determine the transconductance $g_{mn3}$, substitute equations (5) and (6) into equation (4), and determine the derivative of equation (4) according to equation (3). These steps are illustrated as follows.

$$i_D = \frac{1}{2}\mu_N C_{ox}\left(\frac{W}{L}\right)_N (v_{GS} - V_t)^2 + \frac{1}{2}\mu_N C_{ox}(3)\left(\frac{W}{L}\right)_N (v_{GS} - V_t)^2 \tag{12}$$

$$i_D = 2\mu_N C_{ox}\left(\frac{W}{L}\right)_N (v_{GS} - V_t)^2 \tag{13}$$

$$g_{mn3} = \left.\frac{\partial i_D}{\partial v_{GS}}\right|_{v_{gs}=V_{GS}} = 4\mu_N C_{ox}\left(\frac{W}{L}\right)_N (V_{GS} - V_t) \tag{14}$$

Further, the drain current $i_{D,N1}$ of the first NFET N1 is equal to an eighth of the constant tail current $I_N$, or as shown in equation (15), and the drain current $i_{D,N3}$ of the third NFET N3 is equal to three-eighths of the constant tail current $I_N$, or as shown in equation (16).

$$i_{D,N1} = \frac{I_N}{8} \tag{15}$$

$$i_{D,N3} = \frac{3I_N}{8} \tag{16}$$

Substituting either equation (15) into equation (5) or equation (16) into equation (6), and solving for $(V_{GS}-V_t)$ results in equation (17).

$$(V_{GS} - V_t) = \frac{1}{2}\sqrt{\frac{I_N}{\mu_N C_{ox}\left(\frac{W}{L}\right)_N}} \tag{17}$$

Substituting equation (17) into equation (14) results in equation (18).

$$g_{mn3} = \sqrt[2]{\mu_N C_{ox}\left(\frac{W}{L}\right)_N I_N} \tag{18}$$

Figure 3:
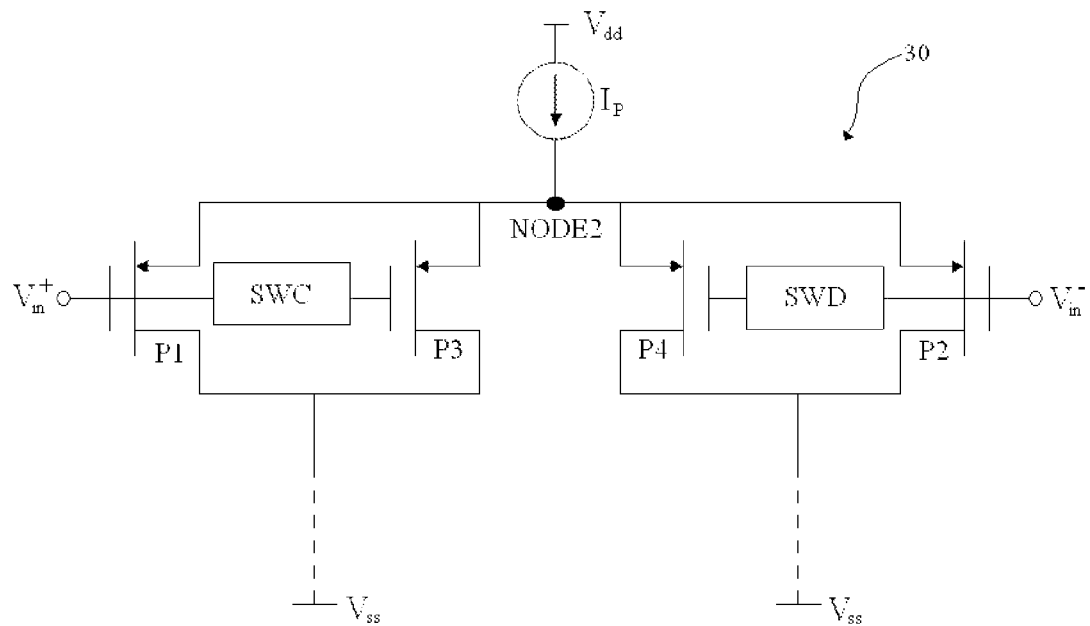
FIG. 3 is a differential op-amp with a switched pair of p-channel field effect transistors (PFETs) according to an embodiment.

FIG. 3 illustrates a differential op-amp 30 with a switched pair of PFETs according to an embodiment. The op-amp 30 comprises a first PFET P1 that has a drain coupled to a drain of a third PFET P3, which is coupled directly or indirectly to a negative power supply voltage $V_{ss}$, as indicated by the dashed line. The sources of the first PFET P1 and the third PFET P3 are couple together and to a constant tail current source $I_p$ at a second node NODE2. The constant tail current source $I_p$ is coupled to a positive power supply voltage $V_{dd}$. The op-amp 30 further comprises a second PFET P2 that has a drain coupled to a drain of a fourth PFET P4, which is coupled directly or indirectly to a negative power supply voltage $V_{ss}$, as indicated by the dashed line. The sources of the second PFET P2 and the fourth PFET P4 are couple together and to the constant tail current source $I_p$ at the second node NODE2.

The gate of the first PFET P1 is coupled to a positive input terminal $V_{in}^+$ of the differential op-amp 30. The gate of the third PFET P3 is coupled to a first switch SWC, which is also coupled to the positive input terminal $V_{in}^+$. The gate of the second PFET P2 is coupled to a negative input terminal $V_{in}^-$ of the differential op-amp 30. The gate of the fourth PFET P4 is coupled to a second switch SWD, which is also coupled to the negative input terminal $V_{in}^-$.

In this embodiment, the active area width-to-length ratio of the first PFET P1 and the second PFET P2 are equal, such that $$\left(\frac{W}{L}\right)_{P1} = \left(\frac{W}{L}\right)_{P2} = \left(\frac{W}{L}\right)_P.$$

The width-to-length ratio of the third PFET P3 and the fourth PFET P4 are equal but three times the width-to-length ratios of the first PFET P1 and the second PFET P2, such that $$\left(\frac{W}{L}\right)_{P3} = \left(\frac{W}{L}\right)_{P4} = 3\left(\frac{W}{L}\right)_P.$$

As will become readily apparent to persons having ordinary skill in the art by the discussion below, other embodiments contemplate all of the width-to-length ratios being equal, but other features of the third PFET P3 and the fourth PFET P4 being three times the value of those features of the first PFET P1 and the second PFET P2. One example may be using a material with a relative permittivity $\in_r$ for the gate dielectric of the third PFET P3 and the fourth PFET P4 that is three times greater than that used for the first PFET P1 and the second PFET P2 such that the capacitance per unit area between the gate electrode and channel $C_{ox}$ for the third PFET P3 and the fourth PFET P4 is three times greater than such capacitance for the first PFET P1 and the second PFET P2.

Figure 4:
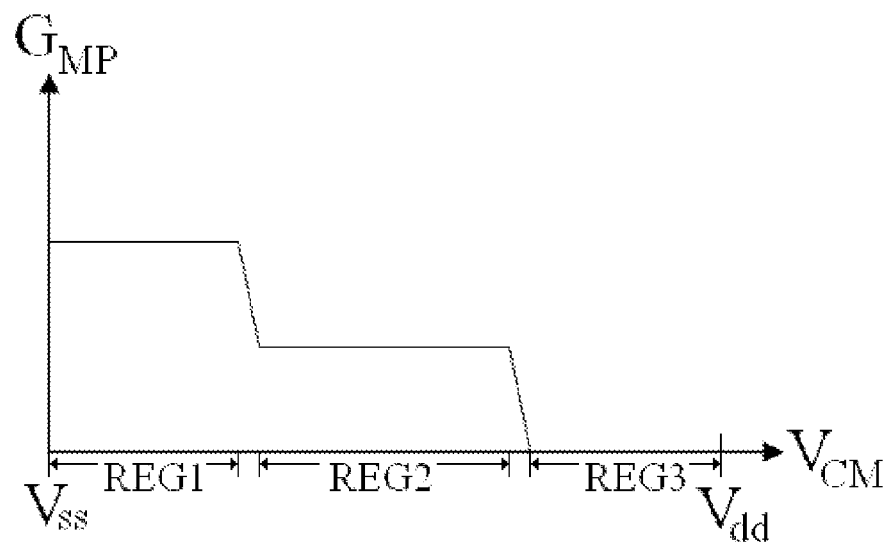
FIG. 4 is a graph illustrating the relative transconductance of the op-amp of FIG. 3 with a common-mode voltage ranging from the negative power supply voltage to the positive power supply voltage.

FIG. 4 is a graph illustrating the relative transconductance $G_{MP}$ of the op-amp 30 with a common-mode voltage $V_{CM}$ ranging from the positive power supply voltage $V_{dd}$ to the negative power supply voltage $V_{ss}$. The transconductance $G_{MP}$ may be defined as follows:

$$G_{MP} = \begin{cases} g_{mp1} & \text{for } REG1 \\ g_{mp2} & \text{for } REG2 \\ g_{mp3} & \text{for } REG3 \end{cases} \quad (19)$$

The first region REG1 is an operating mode in which the first PFET P1 and the second PFET P2 are conducting in saturation, or turned on, and the first switch SWC and the second switch SWD are closed such that the third PFET P3 and the fourth PFET P4 are also conducting in saturation, or turned on. Thus, in the first region REG1, the transconductance $g_{mp1}$ is determined by the first PFET P1, the second PFET P2, the third PFET P3, and the fourth PFET P4, such that the transconductance $g_{mp1}$ is equal to the twice the PFET transconductance $g_{mp}$, or $g_{mp1}=2g_{mp}$. The second region REG2 is an operating mode in which the first PFET P1 and the second PFET P2 are conducting in saturation, or turned on, but the first switch SWC and the second switch SWD are open such that the third PFET P3 and the fourth PFET P4 are not conducting. Thus, in the second region REG2, the transconductance $g_{mp2}$ is determined only by the first PFET P1 and the second PFET P2 such that the transconductance $g_{mp2}$ is equal to the PFET transconductance $g_{mp}$, or $g_{mp2}=g_{mp}$. The third region REG3 is an operating mode in which all of the PFETs are in a non-conducting, or off, state. Thus, in the third region REG3, the transconductance $g_{mp3}$ is zero.

When the common-mode voltage $V_{CM}$ is in the second region REG2, the transconductance $g_{mp2}$ of the op-amp 10 would be, as would be apparent to a person having ordinary skill in the art, equal to $$\sqrt{\mu_P C_{ox} \left(\frac{W}{L}\right)_P I_P},$$

or as shown in equation (20) below:

$$g_{mp2} = g_{mp} = \sqrt{\mu_P C_{ox} \left(\frac{W}{L}\right)_P I_P} \quad (20)$$

The steps and equations for reaching this result are below.

As is known in the art, general transconductance $g_m$ is as defined in equation (3), above. Further, analyzing the left hand side of FIG. 3 independently because of symmetry, the total drain current $i_D$ is the sum of the drain current $i_{D,P1}$ of the first PFET P1 and the drain current $i_{D,P3}$ of the third PFET P3.

$$i_D = i_{D,P1} + i_{D,P3} \quad (21)$$

Even further, the drain current $i_{D,P1}$ and $i_{D,P3}$ for each of the first PFET P1 and the third PFET P3 are defined below, as is also commonly known in the art.

$$i_{D,P1} = \frac{1}{2} \mu_P C_{ox} \left(\frac{W}{L}\right)_P (v_{GS} - V_t)^2 \quad (22)$$

$$i_{D,P3} = \frac{1}{2} \mu_P C_{ox}(3) \left(\frac{W}{L}\right)_P (v_{GS} - V_t)^2 \quad (23)$$

As stated above, when the common-mode voltage $V_{CM}$ is in the second region REG2, the first switch SWC is open which causes the third PFET P3 to not have any voltage applied to its gate resulting in the third PFET P3 not conducting any current. Accordingly, the drain current $i_{D,P3}$ for the third PFET P3 is zero, or $i_{D,P3}=0$. Therefore, equation (22) can be substituted into equation (21), which then has its derivative determined to find the transconductance $g_{mp2}$ as stated in equation (3).

$$g_{mp2} = \left.\frac{\partial i_D}{\partial v_{GS}}\right|_{v_{gs}=V_{GS}} = \mu_P C_{ox} \left(\frac{W}{L}\right)_P (V_{GS} - V_t) \quad (24)$$

Further, as would be apparent to a person having ordinary skill in the art, the drain current $i_{D,P1}$ of the first PFET P1 is equal to half of the constant tail current $I_P$, or as shown in equation (25).

$$i_{D,P1} = \frac{I_P}{2} \quad (25)$$

Substituting equation (22) into equation (25) and solving for $(V_{GS}-V_t)$ results in equation (26).

$$(V_{GS} - V_t) = \sqrt{\frac{I_P}{\mu_P C_{ox} \left(\frac{W}{L}\right)_P}} \quad (26)$$

Substituting equation (26) into equation (24) results in equation (27).

$$g_{mp2} = \sqrt{\mu_P C_{ox} \left(\frac{W}{L}\right)_P I_P} \quad (27)$$

When the common-mode voltage $V_{CM}$ is in the first region REG1, the transconductance $g_{mp1}$ of the op-amp 30 would be equal to $$2\sqrt{\mu_P C_{ox} \left(\frac{W}{L}\right)_P I_P},$$

or as shown in equation (28) below:

$$g_{mp1} = 2g_{mp} = 2\sqrt{\mu_P C_{ox} \left(\frac{W}{L}\right)_P I_P} \quad (28)$$

In the first region REG1, both the first PFET P1 and the third PFET P3 are conducting. Accordingly, to determine the transconductance $g_{mp1}$, substitute equations (22) and (23) into equation (21), and determine the derivative of equation (21) according to equation (3). These steps are illustrated as follows.

$$i_D = \frac{1}{2} \mu_P C_{ox} \left(\frac{W}{L}\right)_P (v_{GS} - V_t)^2 + \frac{1}{2} \mu_P C_{ox}(3) \left(\frac{W}{L}\right)_P (v_{GS} - V_t)^2 \quad (29)$$

$$i_D = 2\mu_P C_{ox} \left(\frac{W}{L}\right)_P (v_{GS} - V_t)^2 \quad (30)$$

$$g_{mp1} = \left.\frac{\partial i_D}{\partial v_{GS}}\right|_{v_{gs}=V_{GS}} = 4\mu_P C_{ox} \left(\frac{W}{L}\right)_P (V_{GS} - V_t) \quad (31)$$

Further, the drain current $i_{D,P1}$ of the first PFET P1 is equal to an eighth of the constant tail current $I_P$, or as shown in equation (32), and the drain current $i_{D,P3}$ of the third PFET P3 is equal to three-eighths of the constant tail current $I_P$, or as shown in equation (33).

$$i_{D,P1} = \frac{I_P}{8} \quad (32)$$

$$i_{D,P3} = \frac{3I_P}{8} \quad (33)$$

Substituting either equation (32) into equation (22) or equation (33) into equation (23), and solving for $(V_{GS}-V_t)$ results in equation (34).

$$(V_{GS} - V_t) = \frac{1}{2}\sqrt{\frac{I_P}{\mu_P C_{ox}\left(\frac{W}{L}\right)_P}} \quad (34)$$

Substituting equation (34) into equation (31) results in equation (35).

$$g_{mp1} = 2\sqrt{\mu_P C_{ox}\left(\frac{W}{L}\right)_P I_P} \quad (35)$$

Figure 5:
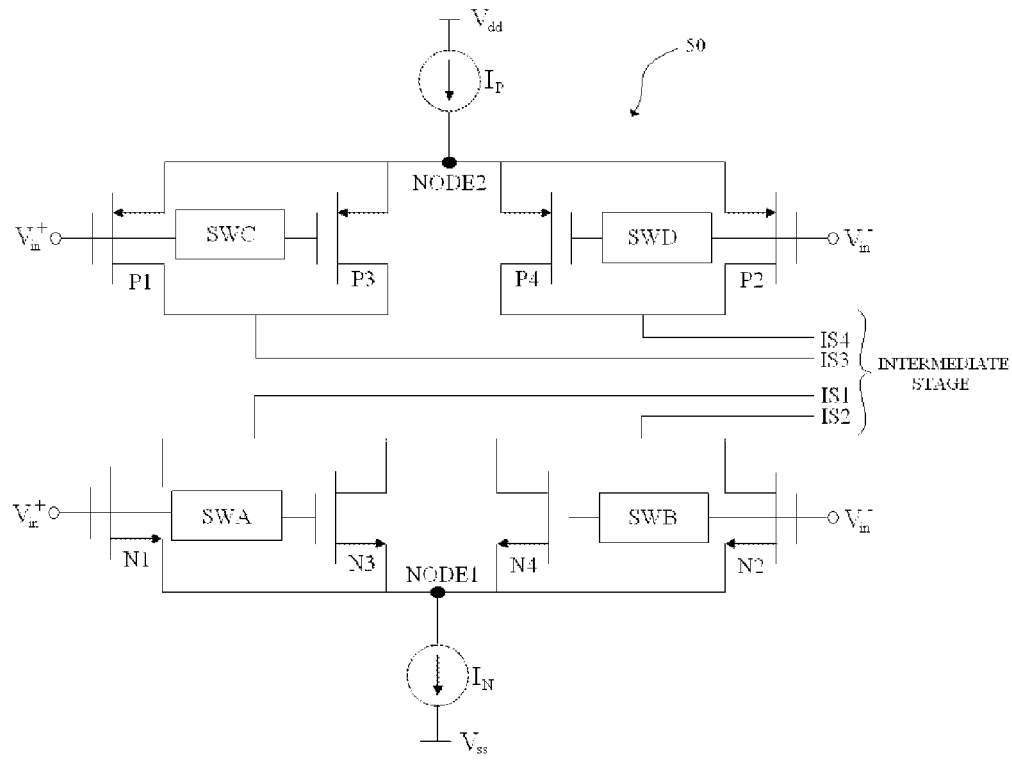
FIG. 5 is a complementary transistor pairs differential op-amp with a switched pair of PFETs and a switched pair of NFETs in a further embodiment.

FIG. 5 is a complementary transistor pairs differential op-amp 50 with a switched pair of PFETs and a switched pair of NFETs in a further embodiment. The op-amp 50 comprises a constant NFET tail current source $I_N$ coupled between a negative power supply voltage $V_{ss}$ and a first node NODE1. Sources of a first NFET N1, a second NFET N2, a third NFET N3, and a fourth NFET N4 are coupled to the first node NODE1. Drains of the first NFET N1 and the third NFET N3 are coupled together and to a first input of an intermediate stage 1S1. Drains of the second NFET N2 and the fourth NFET N4 are coupled together and to a second input of the intermediate stage 1S2. The gate of the first NFET N1 is coupled to a positive input terminal $V_{in}^+$, and the gate of the third NFET N3 is coupled to a first switch SWA, which is also coupled to the positive input terminal $V_{in}^+$. The gate of the second NFET N2 is coupled to a negative input terminal $V_{in}^-$, and the gate of the fourth NFET N4 is coupled to a second switch SWB, which is also coupled to the negative input terminal $V_{in}^-$. This configuration of NFETs and switches is similar to the configuration discussed above with regard to FIG. 1.

The op-amp 50 further comprises a constant PFET tail current source $I_P$ coupled between a positive power supply voltage $V_{dd}$ and a second node NODE2. Sources of a first PFET P1, a second PFET P2, a third PFET P3, and a fourth PFET P4 are coupled to the second node NODE2. Drains of the first PFET P1 and the third PFET P3 are coupled together and to a third input of the intermediate stage 1S3. Drains of the second PFET P2 and the fourth PFET P4 are coupled together and to a fourth input of the intermediate stage 1S4. The gate of the first PFET P1 is coupled to a positive input terminal $V_{in}^+$, and the gate of the third PFET P3 is coupled to a third switch SWC, which is also coupled to the positive input terminal $V_{in}^+$. The gate of the second PFET P2 is coupled to a negative input terminal $V_{in}^-$, and the gate of the fourth PFET P4 is coupled to a fourth switch SWD, which is also coupled to the negative input terminal $V_{in}^-$. This configuration of PFETs and switches is similar to the configuration discussed above with regard to FIG. 3.

As above with respect to FIG. 1, the first NFET N1 and the second NFET N2 have equal width-to-length ratios, and the third NFET N3 and the fourth NFET N4 have equal width-to-length ratios that are three times that of the first NFET N1 and the second NFET N2, or in other words, $$\left(\frac{W}{L}\right)_{N1} = \left(\frac{W}{L}\right)_{N2} = \left(\frac{W}{L}\right)_N \text{ and } \left(\frac{W}{L}\right)_{N3} = \left(\frac{W}{L}\right)_{N4} = 3\left(\frac{W}{L}\right)_N.$$

As above with respect to FIG. 3, the first PFET P1 and the second PFET P2 have equal width-to-length ratios, and the third PFET P3 and the fourth PFET P4 have equal width-to-length ratios that are three times that of the first PFET P1 and the second PFET P2, or in other words, $$\left(\frac{W}{L}\right)_{P1} = \left(\frac{W}{L}\right)_{P2} = \left(\frac{W}{L}\right)_P \text{ and } \left(\frac{W}{L}\right)_{P3} = \left(\frac{W}{L}\right)_{P4} = 3\left(\frac{W}{L}\right)_P.$$

However, other features of these transistors may be altered as would be readily apparent to a person having ordinary skill in the art to achieve the same results as herein discussed. Further, it is assumed that $$\mu_N C_{ox}\left(\frac{W}{L}\right)_N I_N = \mu_P C_{ox}\left(\frac{W}{L}\right)_P I_P,$$

or in other words $g_{mn}=g_{mp}$.

The transconductance $G_M$ of op-amp 50 is the sum of the transconductance $G_{MN}$ of the NFETs and the transconductance $G_{MP}$ of the PFETs as defined above, which definitions are based on the same assumptions of this embodiment.

$$G_M = G_{MN} + G_{MP} \quad (36)$$

Accordingly, the transconductance $g_{m1}$ in the first region REG1 is the defined below:

$$g_{m1} = g_{mn1} + g_{mp1} = 2g_{mp} \quad (37)$$

The transconductance $g_{m2}$ in the second region REG2 is the defined below:

$$g_{m2} = g_{mn2} + g_{mp2} = g_{mn} + g_{mp} = 2g_{mp} \quad (38)$$

The transconductance $g_{m3}$ in the third region REG3 is the defined below:

$$g_{m3} = g_{mn3} + g_{mp3} = 2g_{mn} = 2g_{mp} \quad (39)$$

Figure 6:
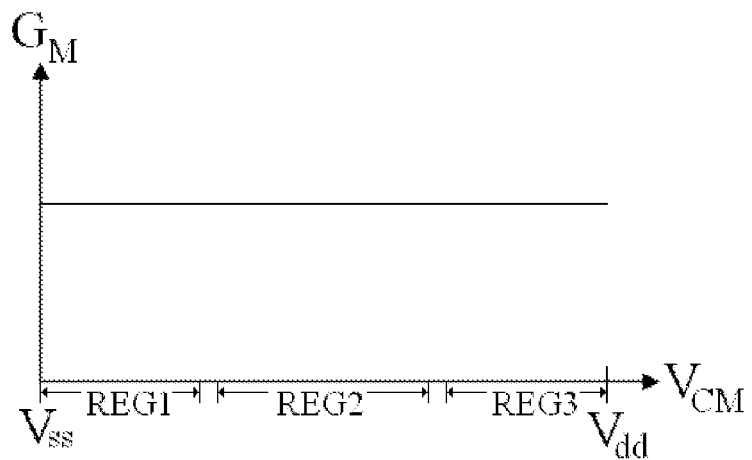
FIG. 6 is a graph illustrating the relative transconductance of the op-amp of FIG. 5 with a common-mode voltage ranging from the negative power supply voltage to the positive power supply voltage.

Therefore, the transconductance $G_M$ of op-amp 50 is constant across the three operating regions, as illustrated in FIG. 6.

Figure 7A:
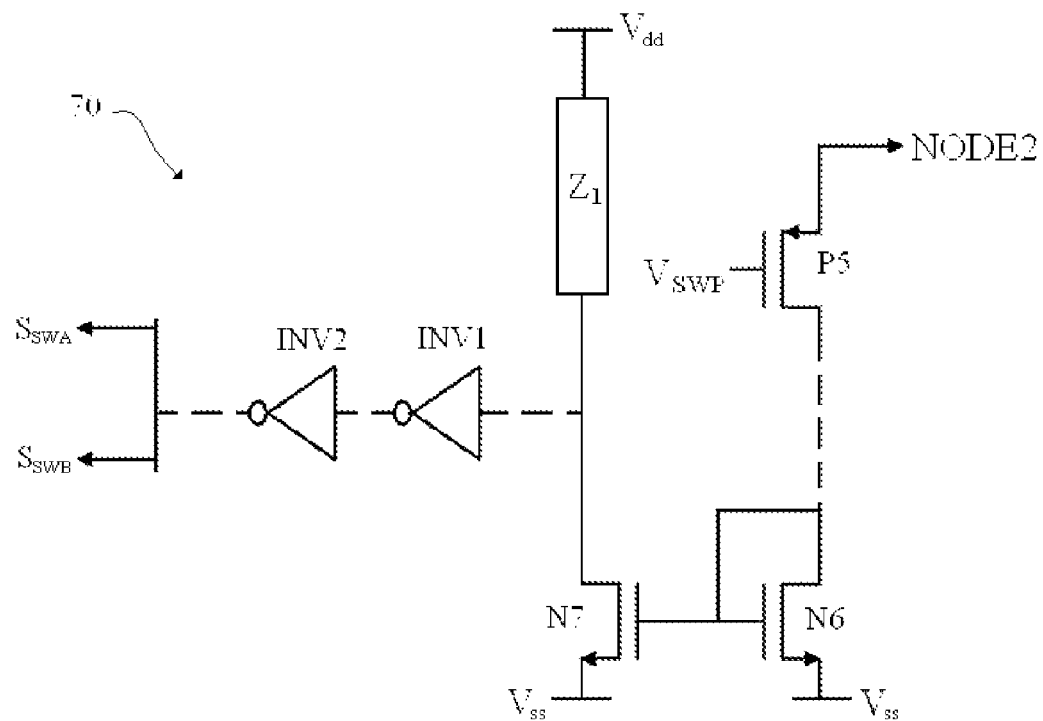
FIGS. 7A and 7B are embodiments of exemplary control circuitry for switching that may be integrated into the embodiment of FIG. 5.
Figure 7B:
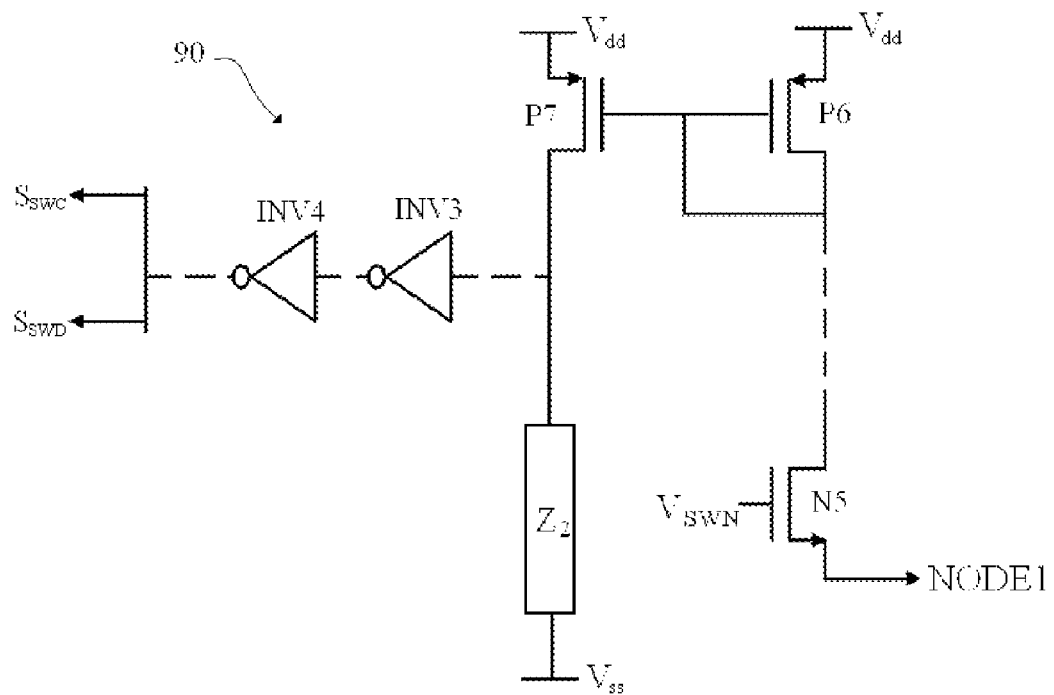

Control circuitry may be necessary to operate the first switch SWA, the second switch SWB, the third switch SWC, and the fourth switch SWD. FIGS. 7A and 7B are embodiments of exemplary control circuitry that may be integrated into the embodiment of FIG. 5. The control circuitry 70 in FIG. 7A comprises a PFET P5 with a source coupled to the second node NODE2 in FIG. 5. The gate of the PFET P5 is coupled to a PFET switching threshold voltage $V_{SWP}$. The drain of the PFET P5 is coupled, either directly or indirectly as indicated by the dashed line, to a drain of a first NFET N6. The drain of the first NFET N6 is coupled to the gates of the first NFET N6 and a second NFET N7. The sources of the first NFET N6 and the second NFET N7 are coupled to a negative power supply voltage $V_{ss}$. The drain of the second NFET N7 is coupled to a logic chain that includes a serially connected first inverter INV1 that is coupled to a first impedance $Z_1$ and a second inverter INV2. The first impedance $Z_1$ is also coupled to a positive power supply voltage $V_{dd}$. The logic chain that includes the first inverter INV1 and the second inverter INV2 outputs a signal $S_{SWA}$ to the first switch SWA and a signal $S_{SWB}$ to the second switch SWB.

The control circuitry 70 operates to sense when the first through fourth PFETs P1, P2, P3, and P4 in FIG. 5 begin to transition between non-conducting and conducting states to determine when to send the signals $S_{SWA}$ and $S_{SWB}$ to the first switch SWA and the second switch SWB to allow the third NFET N3 and the fourth NFET N4 to begin conducting. As the first through fourth PFETs P1, P2, P3, and P4 stop conducting current, current from the constant tail current source $I_P$ is diverted to the source of the PFET P5 in FIG. 7A. The PFET switching threshold voltage $V_{SWP}$ may tune the voltage drop across the source and drain of the PFET P5, which will affect the voltage applied to the gate of the second NFET N7. The voltage applied to the gate of the second NFET N7 will determine the amount of current flowing through the first impedance $Z_1$ and the second NFET N7. As the current flowing through the first impedance $Z_1$ increases, the voltage input into the first inverter INV1 decreases. Once the voltage input into the first inverter INV1 decreases below a certain threshold, the first inverter INV1 will output a high voltage to second inverter INV2. The second inverter INV2 will invert the voltage to a low voltage and will output the low voltage as the signals $S_{SWA}$ and $S_{SWB}$ to the first switch SWA and the second switch SWB.

Figure 8A:
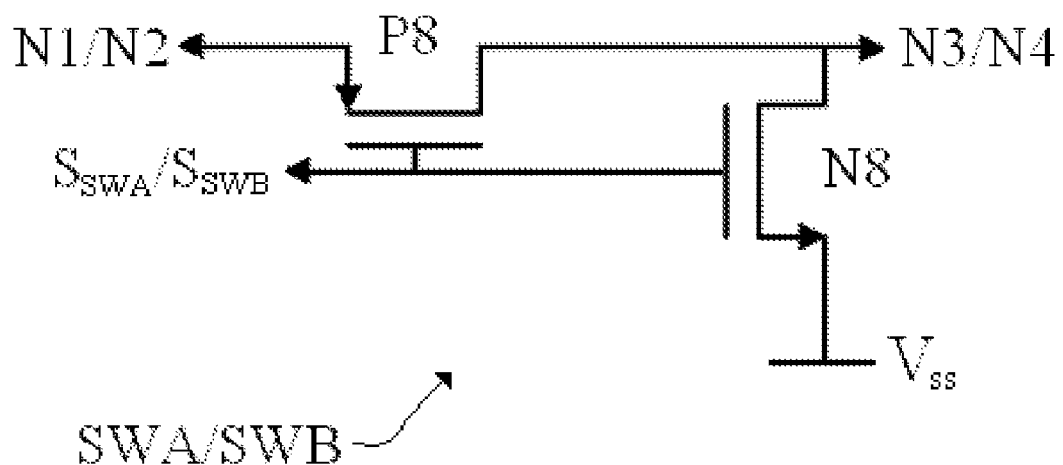
FIGS. 8A and 8B are exemplary switches according to an embodiment.

An example of the first switch SWA and the second switch SWB is illustrated in FIG. 8A. Throughout this embodiment, connections to other components in other figures are designated. These designations indicate connections that depend upon whether the embodiment is used as the first switch SWA or the second switch SWB. Connections corresponding to use as the first switch SWA are indicated first, i.e. before the "/", and connections corresponding to use as the second switch SWB are indicated second, i.e. after the "/". The exemplary switch SWA/SWB in this embodiment comprises a PFET P8 and an NFET N8. The signal $S_{SWA}/S_{SWB}$ to the switch SWA/SWB is coupled to the gates of the PFET P8 and the NFET N8. The source of the PFET P8 is coupled to the gate of the first or second NFET N1/N2, and the drain of the PFET P8 is coupled to the gate of the third or fourth NFET N3/N4 in FIG. 5. The drain of the NFET N8 is also coupled to the gate of the third or fourth NFET N3/N4, and the source of the NFET N8 is coupled to a negative power supply voltage $V_{ss}$.

The combination of the PFET P8 and the NFET N8 operates to electrically couple the gates of NFETs in FIG. 5 when the signal $S_{SWA}/S_{SWB}$ is low and to disconnect those gates when the signal $S_{SWA}/S_{SWB}$ is high. When the signal $S_{SWA}/S_{SWB}$ is low, the PFET P8 closes such that gates of the first NFET N1 and the third NFET N3 are electrically coupled together or gates of the second NFET N2 and the fourth NFET N4 are electrically coupled together. This causes the positive input terminal $V_{in}^+$ to be applied to the third NFET N3 and the negative input terminal $V_{in}^-$ to be applied to the fourth NFET N4. This allows the third NFET N3 and the fourth NFET N4 to be conducting in the third region REG3, and thus, doubles the NFET transconductance $G_{MN}$ of the op-amp 50. Further, when the signal $S_{SWA}/S_{SWB}$ is low, the NFET N8 is open such that the gate of the third or fourth NFET N3/N4 is disconnected from the negative power supply voltage $V_{ss}$. Conversely, when the signal $S_{SWA}/S_{SWB}$ is high, the PFET P8 opens such that gates of the first NFET N1 and the third NFET N3 are disconnected from each other or gates of the second NFET N2 and the fourth NFET N4 are disconnected. Further, when the signal $S_{SWA}/S_{SWB}$ is high, the NFET N8 closes such that the gate of the third or fourth NFET N3/N4 is electrically coupled to the negative power supply voltage $V_{ss}$ to cause the third or fourth NFET N3/N4 to remain open and prevent any floating device effects.

FIG. 7B illustrates further control circuitry in accordance with an embodiment. The control circuitry 90 comprises an NFET N5 with a source coupled to the first node NODE1 in FIG. 5. The gate of the NFET N5 is coupled to an NFET switching threshold voltage $V_{SWN}$. The drain of the NFET N5 is coupled, either directly or indirectly as indicated by the dashed line, to a drain of a first PFET P6. The drain of the first PFET P6 is coupled to the gates of the first PFET P6 and a second PFET P7. The sources of the first PFET P6 and the second PFET P7 are coupled to a positive power supply voltage $V_{dd}$. The drain of the second PFET P7 is coupled to a logic chain that includes a serially connected third inverter INV3 that is coupled to a second impedance $Z_2$ and a fourth inverter INV4. The second impedance $Z_2$ is also coupled to a negative power supply voltage $V_{ss}$. The logic chain that includes the third inverter INV3 and the fourth inverter INV4 outputs a signal $S_{SWC}$ to the third switch SWC and a signal $S_{SWD}$ the fourth switch SWD.

The control circuitry 90 operates to sense when the first through fourth NFETs N1, N2, N3, and N4 in FIG. 5 begin to transition to a non-conducting state to determine when to send the signals $S_{SWC}$ and $S_{SWD}$ to the third switch SWC and the fourth switch SWD to allow the third PFET P3 and the fourth PFET P4 to begin conducting. As the first through fourth NFETs N1, N2, N3, and N4 stop conducting current, current from the constant tail current source $I_N$ is diverted to the source of the NFET N5 in FIG. 7B. The NFET switching threshold voltage $V_{SWN}$ may tune the voltage drop across the source and drain of the NFET N5, which will affect the voltage applied to the gate of the second PFET P7. The voltage applied to the gate of the second PFET P7 will determine the amount of current flowing through the second impedance $Z_2$ and the second PFET P7. As the current flowing through the second impedance $Z_2$ increases, the voltage input into the third inverter INV3 increases. Once the voltage input into the third inverter INV3 increases above a certain threshold, the third inverter INV3 will output a low voltage to the fourth inverter INV4. The fourth inverter INV4 will invert the voltage to a high voltage and will output the high voltage as the signal $S_{SWC}$ to the third switch SWC and as the signal $S_{SWD}$ to the fourth switch SWD.

Figure 8B:
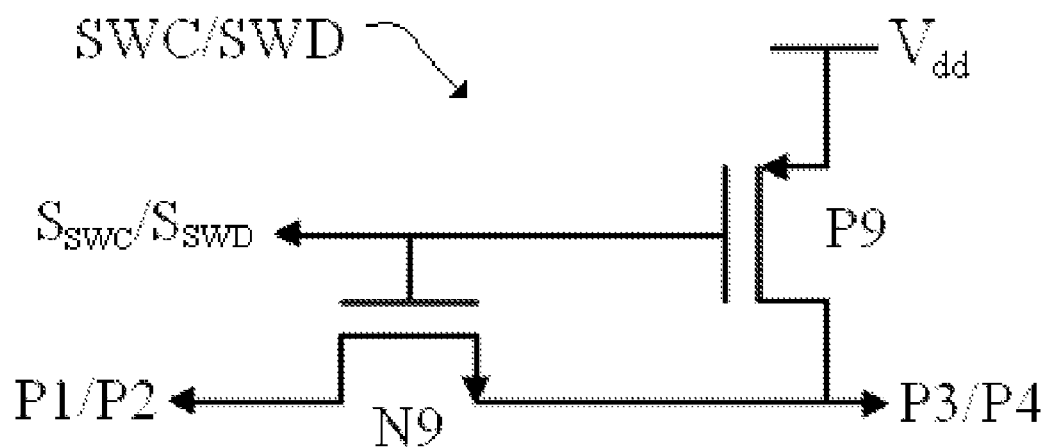

An example of the third switch SWC and the fourth switch SWD is illustrated in FIG. 8B. Similar to FIG. 8A, the designated connections depend upon whether the embodiment is used as the third switch SWC, indicated before the "/", or the fourth switch SWD, indicated after the "/". The exemplary switch SWC/SWD in this embodiment comprises a PFET P9 and an NFET N9. The signal $S_{SWC}/S_{SWD}$ to the switch SWC/SWD is coupled to the gates of the PFET P9 and the NFET N9. The drain of the NFET N9 is coupled to the gate of the first or second PFET P1/P2, and the source of the NFET N9 is coupled to the gate of the third or fourth PFET P3/P4 in FIG. 5. The drain of the PFET P9 is also coupled to the gates of the third or fourth PFET P3/P4, and the source of the PFET P9 is coupled to a positive power supply voltage $V_{dd}$.

The combination of the PFET P9 and the NFET N9 operates to electrically couple the gates of PFETs in FIG. 5 when the signal $S_{SWC}/S_{SWD}$ is high and to disconnect those gates when the signal $S_{SWC}/S_{SWD}$ is low. When the signal $S_{SWC}/S_{SWD}$ is high, the NFET N9 closes such that gates of the first PFET P1 and the third PFET P3 are electrically coupled together or gates of the second PFET P2 and the fourth PFET P4 are electrically coupled together. This causes the positive input terminal $V_{in}^+$ to be applied to the third PFET P3 and the negative input terminal $V_{in}^-$ to be applied to the fourth PFET P4. This allows the third PFET P3 and the fourth PFET P4 to be conducting in the first region REG1, and thus, doubles the PFET transconductance $G_{MN}$ of the op-amp 50. Further, when the signal $S_{SWC}/S_{SWD}$ is high, the PFET P9 is open such that the gate of the third or fourth PFET P3/P4 is disconnected from the positive power supply voltage $V_{dd}$. Conversely, when the signal $S_{SWC}/S_{SWD}$ is low, the NFET N9 opens such that gates of the first PFET P1 and the third PFET P3 are disconnected from each other or gates of the second PFET P2 and the fourth PFET P4 are disconnected. Further, when the signal $S_{SWC}/S_{SWD}$ is low, the PFET P9 closes such that the gate of the third or fourth PFET P3/P4 is electrically coupled to the positive power supply voltage $V_{dd}$ to cause the third or fourth PFET P3/P4 to remain open and prevent any floating device effects.

A person having ordinary skill in the art will readily understand that the control circuitry 70 and 90 may be varied to accommodate different functionalities. For example, the switching threshold voltages $V_{SWP}$ and $V_{SWN}$ may be altered to tune the common mode voltage $V_{CM}$ at which any of the switches SWA, SWB, SWC, and SWD may turn on or turn off. Further, the first impedance $Z_1$ or the second impedance $Z_2$ may be altered to further tune these circuits. Other variables may be readily known. Further, a person having ordinary skill in the arty will readily understand that the exemplary switches SWA/SWB and SWC/SWD may be altered, such as by switching the gate coupling FETs from an NFET to a PFET or vice versa or by using transmission gates in the place of the FETs. In some instances, inverse logic may be necessary for different inputs to gates of certain FETS.

Figure 9A:
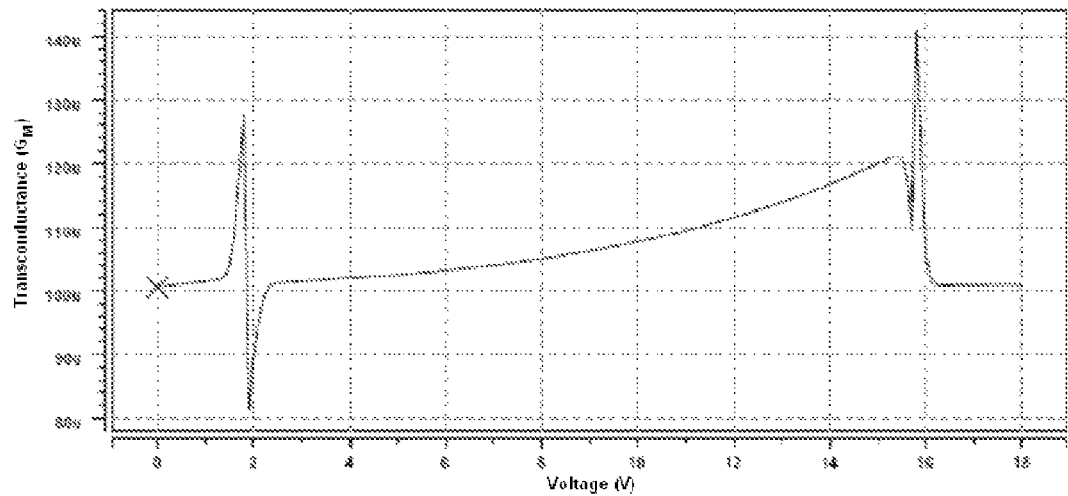
FIG. 9A is the transconductance of an op-amp similar to the embodiment of FIG. 5 as found through testing a 200 nm high voltage model by sweeping between zero volts and eighteen volts as the common-mode voltage.
Figure 9B:
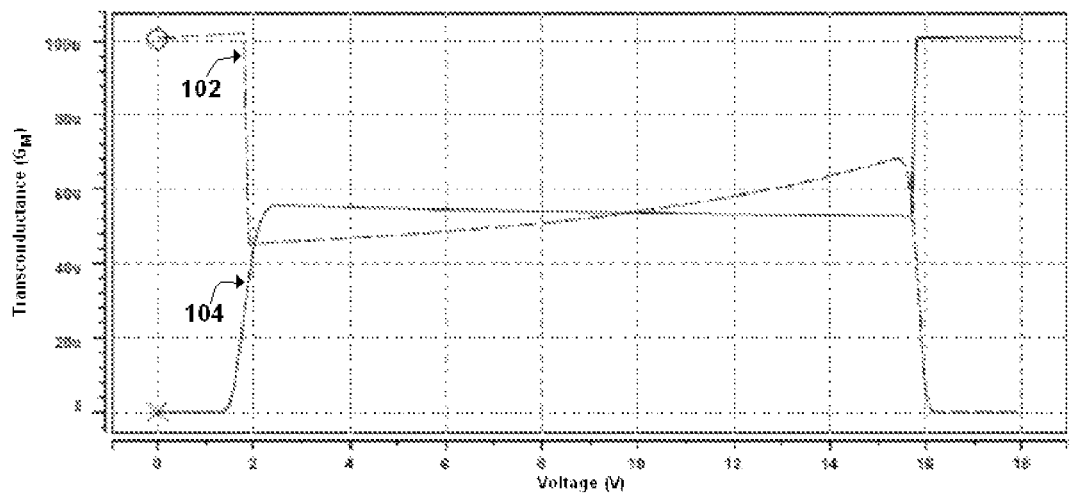
FIG. 9B is a graph illustrating the contributions to the total transconductance from the PFETs and the NFETs.

The inventors have realized an embodiment of the example of FIG. 5. Results of tests performed on this realization are illustrated in FIGS. 9A and 9B. FIG. 9A is the transconductance $G_M$ as found through testing a 200 nm high voltage model by sweeping between zero volts and eighteen volts as the common-mode voltage $V_{CM}$. The variation in the transconductance $G_M$ is roughly forty percent, however, most of the variation may be a result of one of the complementary pairs of transistors turning on or off with the other having the third and fourth transistors turning off or on. Further refining of the embodiment may result in more closely matching the turning on or off of transistors such that the variation is further decreased. FIG. 9B is similar to FIG. 9A except that the contributions to the total transconductance $G_M$ from the PFETs 102 and the NFETs 104 are separately illustrated. As can be seen from FIG. 9B, FIG. 9A is the sum of the contributions of the PFETs 102 and the NFETs 104.

A further advantage of embodiments is that less current may be consumed by an op-amp configured according to those embodiments. By additional parallel transistors with increased width-to-length ratios that may be turned on by switching as discussed above, the current consumption may be much less than prior art op-amps that use current steering to increase the current through transistor pairs when the other pair is not conducting. Similarly, without current steering, an output current may have less variation, which will allow for easier next stage design.

Figure 10A:
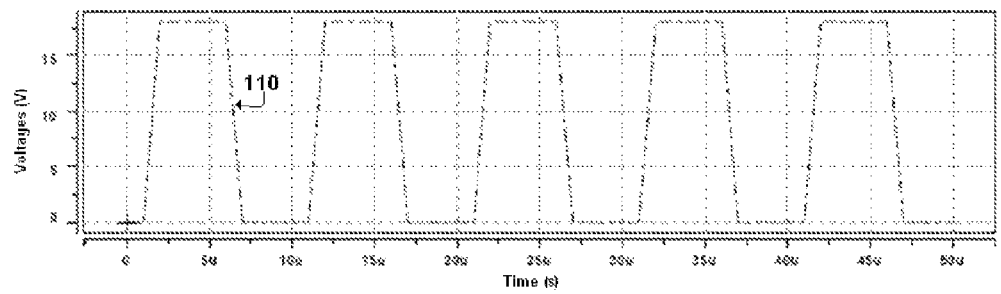
FIGS. 10A through 10C are graphs illustrating a clock signal and the corresponding switch control signals when the clock signal is 100 kHz and is input as a common-mode voltage into an embodiment similar to FIG. 5.
Figure 10B:
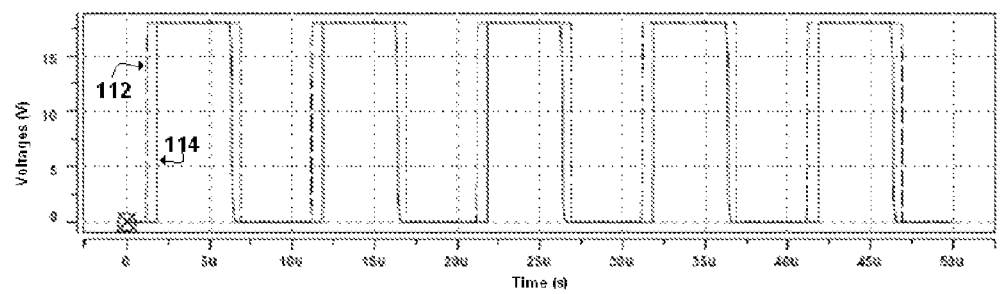

Another advantage is that embodiments may be used in higher frequency applications, such as with liquid crystal displays (LCDs). FIG. 10A illustrates a clock signal 110 that is input as a common-mode voltage $V_{CM}$ into an embodiment. The clock signal 110 has a frequency of 100 kHz. FIG. 10B illustrates the corresponding switch control signals. Control signal 112 is the signal applied to a PFET switch that controls whether a positive input terminal $V_{in}^+$ or a negative input terminal $V_{in}^-$ is coupled to other PFETs, such as the third PFET P3 and the fourth PFET P4 in FIG. 5. The control signal 112 may be the signal output for the third switch SWC and the fourth switch SWD in FIG. 7B. Similarly, control signal 114 is the signal applied to an NFET switch that controls whether a positive input terminal $V_{in}^+$ or a negative input terminal $V_{in}^-$ is coupled to other NFETs, such as the third NFET N3 and the fourth NFET N4 in FIG. 5. The control signal 114 may be the signal output for the first switch SWA and the second switch SWB in FIG. 7A.

Figure 10C:
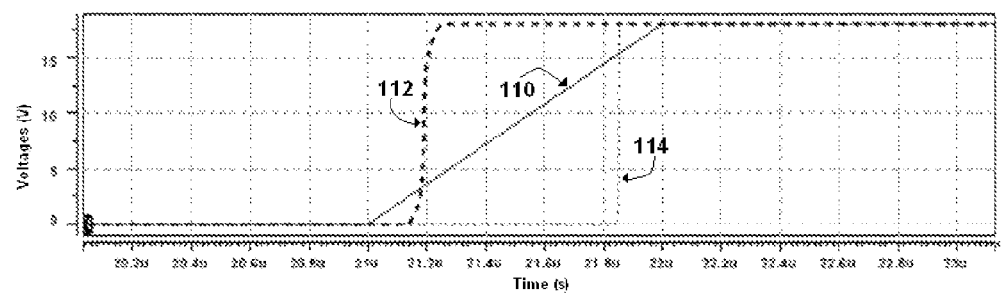

FIG. 10C has the clock signal 110 and the control signals 112 and 114 overlaid in a time frame between 20 µs and 23 µs. The clock signal 110 is at zero volts before 21 µs and starts to increase thereafter. Before 21.2 µs, all four of the PFETs are conducting and contributing to the transconductance $G_M$, but none of the NFETs are conducting. Around approximately 21.2 µs, the clock signal 110 is at a voltage high enough to cause the NFET pair to conduct, and accordingly, the control signal 112 goes high to turn off the additional PFETs, such as the third PFET P3 and the fourth PFET P4 in FIG. 5. Both the PFET and the NFET pairs are subsequently conducting without any additional transistors. Shortly after 21.8 µs, the clock signal 110 has a voltage that causes the PFET pair to stop conducting, and accordingly, the control signal 114 goes high to turn on the additional NFETs, such as the third NFET N3 and the fourth NFET N4 in FIG. 5. Thereafter, all four of the NFETs are conducting and contributing to the transconductance $G_M$. This example illustrates that embodiments are capable of operating at higher frequencies than that of the prior art.

Although embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a first transistor, a second transistor, a third transistor, a fourth transistor, wherein:
     the first transistor, the second transistor, the third transistor, and the fourth transistor are all of a same conductivity type,
     sources of the first transistor, the second transistor, the third transistor, and the fourth transistor are electrically coupled together,
     drains of the first transistor and the third transistor are electrically coupled together,
     drains of the second transistor and the fourth transistor are electrically coupled together, a feature of the third transistor is three times a feature of the first transistor such that $$3\left[\mu C_{ox}\left(\frac{W}{L}\right)\right]_{T1} = \left[\mu C_{ox}\left(\frac{W}{L}\right)\right]_{T3}$$

is satisfied where "T1" denotes the first transistor and "T3" denotes the third transistor,
a feature of the fourth transistor is three times a feature of the second transistor such that $$3\left[\mu C_{ox}\left(\frac{W}{L}\right)\right]_{T2} = \left[\mu C_{ox}\left(\frac{W}{L}\right)\right]_{T4}$$

is satisfied where "T2" denotes the second transistor and "T4" denotes the fourth transistor, wherein $C_{ox}$ comprises a gate dielectric capacitance of a respective transistor, W is a width of a channel of the respective transistor, and L is a length of the channel of the respective transistor;
a first switch operable to selectively electrically couple a first input terminal to a gate of the third transistor; and
a second switch operable to selectively electrically couple a second input terminal to a gate of the fourth transistor.

2. The circuit of claim 1 further comprising a current source electrically coupled to the sources of the first transistor, the second transistor, the third transistor, and the fourth transistor.

3. The circuit of claim 1, wherein the feature of the third transistor comprises a width-to-length ratio that is three times a width-to-length ratio of the first transistor such that $$3\left(\frac{W}{L}\right)_{T1} = \left(\frac{W}{L}\right)_{T3},$$

and wherein the feature of the fourth transistor comprises a width-to-length ratio that is three times a width-to-length ratio of the second transistor such that $$3\left(\frac{W}{L}\right)_{T2} = \left(\frac{W}{L}\right)_{T4}.$$

4. The circuit of claim 1, wherein the first switch and the second switch are each operable to selectively electrically couple in response to a first control signal.

5. The circuit of claim 1, wherein the first transistor, the second transistor, the third transistor, and the fourth transistor are each a p-channel field effect transistor (PFET).

6. The circuit of claim 1, wherein the first transistor, the second transistor, the third transistor, and the fourth transistor are each an n-channel field effect transistor (NFET).

7. An operational amplifier comprising:
a first n-channel field effect transistor (NFET), a second NFET, a third NFET, and a fourth NFET, wherein:
respective sources of the first NFET, the second NFET, the third NFET, and the fourth NFET are electrically coupled together,
respective drains of the first NFET and the third NFET are electrically coupled together, and respective drains of the second NFET and the fourth NFET are electrically coupled together,
a feature of the third NFET is three times a feature of the first NFET such that $$3\left[\mu C_{ox}\left(\frac{W}{L}\right)\right]_{N1} = \left[\mu C_{ox}\left(\frac{W}{L}\right)\right]_{N3}$$

is satisfied where "N1" denotes the first NFET and "N3" denotes the third NFET,
a feature of the fourth NFET is three times a feature of the second NFET such that $$3\left[\mu C_{ox}\left(\frac{W}{L}\right)\right]_{N2} = \left[\mu C_{ox}\left(\frac{W}{L}\right)\right]_{N4}$$

is satisfied where "N2" denotes the second NFET and "N4" denotes the fourth NFET;
a first p-channel field effect transistor (PFET), a second PFET, a third PFET, and a fourth PFET, wherein:
respective sources of the first PFET, the second PFET, the third PFET, and the fourth PFET are electrically coupled together,
respective drains of the first PFET and the third PFET are electrically coupled together, and respective drains of the second PFET and the fourth PFET are electrically coupled together,
a feature of the third PFET is three times a feature of the first PFET such that $$3\left[\mu C_{ox}\left(\frac{W}{L}\right)\right]_{P1} = \left[\mu C_{ox}\left(\frac{W}{L}\right)\right]_{P3}$$

is satisfied where "P1" denotes the first PFET and "P3" denotes the third PFET,
a feature of the fourth PFET is three times a feature of the second PFET such that $$3\left[\mu C_{ox}\left(\frac{W}{L}\right)\right]_{P2} = \left[\mu C_{ox}\left(\frac{W}{L}\right)\right]_{P4}$$

is satisfied where "P2" denotes the second PFET and "P4" denotes the fourth PFET, wherein $C_{ox}$ comprises a gate dielectric capacitance of a respective transistor, W is a width of a channel of the respective transistor, and L is a length of the channel of the respective transistor;
a first switch operable to selectively electrically couple a first input terminal to a gate of the third NFET, wherein a gate of the first NFET is also electrically coupled to the first input terminal; and
a second switch operable to selectively electrically couple the first input terminal to a gate of the third PFET, wherein a gate of the first PFET is also electrically coupled to the first input terminal.

8. The operational amplifier of claim 7 further comprising:
a third switch operable to selectively couple a second input terminal to a gate of the fourth NFET; and
a fourth switch operable to selectively couple the second input terminal to a gate of the fourth PFET, wherein respective gates of the second NFET and the second PFET are also electrically coupled to the second input terminal.

9. The operational amplifier of claim 7, wherein:
the feature of the third NFET comprises a width-to-length ratio that is three times a width-to-length ratio of the first NFET such that $$3\left(\frac{W}{L}\right)_{N1} = \left(\frac{W}{L}\right)_{N3},$$

the feature of the fourth NFET comprises a width-to-length ratio that is three times a width-to-length ratio of the second NFET such that $$3\left(\frac{W}{L}\right)_{N2} = \left(\frac{W}{L}\right)_{N4},$$

the feature of the third PFET comprises a width-to-length ratio that is three times a width-to-length ratio of the first PFET such that $$3\left(\frac{W}{L}\right)_{P1} = \left(\frac{W}{L}\right)_{P3},$$

and
the feature of the fourth PFET comprises a width-to-length ratio that is three times a width-to-length ratio of the second PFET such that $$3\left(\frac{W}{L}\right)_{P2} = \left(\frac{W}{L}\right)_{P4}.$$

10. The operational amplifier of claim 7, wherein $$\left[\mu C_{ox}\left(\frac{W}{L}\right)\right]_{N1} = \left[\mu C_{ox}\left(\frac{W}{L}\right)\right]_{N2} \text{ and } \left[\mu C_{ox}\left(\frac{W}{L}\right)\right]_{P1} = \left[\mu C_{ox}\left(\frac{W}{L}\right)\right]_{P2}.$$

11. The operational amplifier of claim 7, wherein:
the first switch comprises a fifth PFET and a fifth NFET, wherein the fifth PFET and the fifth NFET are configured to exclusively selectively electrically couple the first input terminal to the gate of the third NFET or electrically couple the gate of the third NFET to a negative power supply voltage, and
the second switch comprises a sixth PFET and a sixth NFET, wherein the sixth PFET and the sixth NFET are configured to exclusively selectively electrically couple the first input terminal to the gate of the third PFET or electrically couple the gate of the third PFET to a positive power supply voltage.

12. The operational amplifier of claim 7 further comprising control circuitry operable to send a control signal to at least one of the first switch and the second switch, wherein the at least one of the first switch and the second switch selectively electrically couples in response to the control signal.

13. The operational amplifier of claim 7 further comprising control circuitry operable to send a first control signal to the first switch and operable to send a second control signal to the second switch, wherein the first switch selectively electrically couples in response to the first control signal, and wherein the second switch selectively electrically couples in response to the second control signal.

14. The operational amplifier of claim 7 further comprising:
a first current source electrically coupled to the sources of the first NFET, the second NFET, the third NFET, and the fourth NFET, wherein the first current source produces a first current $I_N$; and
a second current source electrically coupled to the sources of the first PFET, the second PFET, the third PFET, and the fourth PFET, wherein the second current source produces a second current $I_P$, wherein $$I_N\left[\mu C_{ox}\left(\frac{W}{L}\right)\right]_{N1} = I_P\left[\mu C_{ox}\left(\frac{W}{L}\right)\right]_{P1}$$

is satisfied.

15. The operation amplifier of claim 14 further comprising control circuitry electrically coupled to the sources of the first NFET, the second NFET, the third NFET, and the fourth NFET, wherein the control circuitry is operable to sense when the first NFET, the second NFET, the third NFET, and the fourth NFET are all in a non-conducting state, and is operable to send a control signal to the second switch such that the second switch electrically couples the first input terminal to the gate of the third PFET in response to the control signal.

16. The operation amplifier of claim 14 further comprising control circuitry electrically coupled to the sources of the first PFET, the second PFET, the third PFET, and the fourth PFET, wherein the control circuitry is operable to sense when the first PFET, the second PFET, the third PFET, and the fourth PFET are all in a non-conducting state, and is operable to send a control signal to the first switch such that the first switch electrically couples the first input terminal to the gate of the third NFET in response to the control signal.

17. A method for operating an operation amplifier, the method comprising:
sensing a first transition between a conducting state and a non-conducting state of a first pair of transistors; and
selectively electrically coupling a gate of one of a first switched pair of transistors to a gate of one of a second pair of transistors and electrically coupling a gate of another of the first switched pair of transistors to a gate of another of the second pair of transistors in response to the sensing the first transition, wherein the respective gates of the first switched pair of transistors are electrically decoupled from the respective gates of the second pair of transistors when the first transition is from the non-conducting state to the conducting state, and the respective gates of the first switched pair of transistors are electrically coupled to the respective gates of the second pair of transistors when the first transition is from the conducting state to the non-conducting state.

18. The method of claim 17 further comprising:
sensing a second transition between a conducting state and a non-conducting state of the second pair of transistors; and
selectively electrically coupling a gate of one of a second switched pair of transistors to a gate of one of the first pair of transistors and electrically coupling a gate of another of the second switched pair of transistors to a gate of another of the first pair of transistors in response to the sensing the second transition, wherein the respective gates of the second switched pair of transistors are electrically decoupled from the respective gates of the first pair of transistors when the second transition is from the non-conducting state to the conducting state, and the respective gates of the second switched pair of transistors are electrically coupled to the respective gates of the first pair of transistors when the second transition is from the conducting state to the non-conducting state.

19. The method of claim 17, wherein a feature of the one of the first switched pair of transistors is three times a feature of the one of the second pair of transistors, and wherein a feature of the another of the first switched pair of transistors is three times a feature of the second pair of transistors.

20. The method of claim 19, wherein the features of the first switched pair of transistors and the features of the second pair of transistors each comprises a width-to-length ratio.

21. The method of claim 17, wherein:
the sensing the first transition comprises:
    sensing a diverted current from the first pair of transistors,
    providing a mirrored current of the diverted current through an impedance,
    inputting into a logic chain a voltage that results from the mirrored current flowing through the impedance, and
    outputting a control signal from the logic chain, and
the selectively electrically coupling in response to the sensing the first transition comprises selectively electrically coupling in response to the control signal.

* * * * *